(12) United States Patent
Tang

(10) Patent No.: US 6,735,139 B2
(45) Date of Patent: May 11, 2004

(54) SYSTEM AND METHOD FOR PROVIDING ASYNCHRONOUS SRAM FUNCTIONALITY WITH A DRAM ARRAY

(75) Inventor: Robin Tang, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/017,608

(22) Filed: Dec. 14, 2001

(65) Prior Publication Data

US 2003/0112687 A1 Jun. 19, 2003

(51) Int. Cl.[7] ................................................. G11C 7/00
(52) U.S. Cl. ................ 365/222; 365/189.01; 365/233.5
(58) Field of Search ................................. 365/222, 233, 365/233.5, 189.01, 189.07, 203

(56) References Cited

U.S. PATENT DOCUMENTS

| 5,276,843 A | 1/1994 | Tillinghast et al. ......... 711/105 |
| 5,335,201 A | 8/1994 | Walther et al. ............. 365/222 |
| 5,430,681 A | 7/1995 | Sugawara et al. .......... 365/222 |
| 5,550,781 A | 8/1996 | Sugawara et al. .......... 365/222 |
| 5,566,121 A | 10/1996 | Hadderman et al. ........ 365/222 |
| 5,615,328 A | 3/1997 | Hadderman et al. .......... 714/22 |
| 5,845,312 A | 12/1998 | Kimura et al. .............. 711/105 |
| 5,893,136 A | 4/1999 | Stolt et al. .................. 711/105 |
| 6,028,804 A * | 2/2000 | Leung ......................... 365/222 |
| 6,198,657 B1 | 3/2001 | Uekubo et al. ......... 365/185.04 |
| 6,212,128 B1 | 4/2001 | Pascucci .................. 365/233.5 |
| 6,275,437 B1 * | 8/2001 | Kim et al. .................. 365/222 |
| 6,370,073 B2 * | 4/2002 | Leung ........................ 365/222 |
| 6,392,958 B1 * | 5/2002 | Lee .......................... 365/233.5 |
| 6,463,002 B2 * | 10/2002 | Kim et al. .................. 365/222 |

* cited by examiner

Primary Examiner—Gene Auduong
(74) Attorney, Agent, or Firm—Gray Cary Ware & Freidenrich, LLP; David L. Alberti

(57) ABSTRACT

A system 100 which provides asynchronous SRAM functionality with a DRAM device. The system 100 includes an address transition detector circuit 102, a memory clock generator circuit 104, a refresh timer 106, a refresh address counter 108, a memory access controller 110, a memory control sequencer 112, an address buffer 114, a write data buffer 116, a three-input address multiplexer 118, a two-input data multiplexer 120, inverters 122, 124, 126, and 128, AND gates 130, 132, and 134, NOR gates 136, 138, 140, and 142, OR gate 156, and a DRAM array 144 of memory cells. The components of system 100 cooperate to selectively interrupt external memory commands, such as read and write commands, in order to perform refresh operations on array 144.

14 Claims, 8 Drawing Sheets

SYSTEM AND METHOD FOR PROVIDING ASYNCHRONOUS SRAM FUNCTIONALITY WITH A DRAM ARRAY

FIELD OF THE INVENTION

The present invention generally relates to semiconductor memory devices that must be periodically refreshed, such as dynamic random access memory ("DRAM") devices. More particularly, the present invention relates to a system and method which provides asynchronous static random access memory ("SRAM") functionality with a DRAM array by selectively interrupting external memory commands, such as read and write commands, to perform internal refresh operations.

BACKGROUND OF THE INVENTION

An SRAM is one type of semiconductor memory device that typically utilizes several transistors within each memory cell of the device to store electronic data. The static storage mechanism of an SRAM has the benefit of not requiring any refresh cycles to maintain stored data. However, the relatively large number of transistors required to form the memory cells within SRAM devices undesirably increase the cost and size of these semiconductor memory devices relative to other types of devices.

A DRAM is another type of semiconductor memory device, which typically utilizes a single transistor and a capacitor within each memory cell of the device to store electronic data. Unlike an SPAM device, a DRAM device requires periodic refreshing in order to maintain stored data. While DRAM devices typically have a reduced cost and increased memory density relative to SRAM devices, DRAM devices require refresh cycles to retain data.

Many systems are adapted to operate with only DRAM devices or with only SRAM devices, such as asynchronous SRAM devices. In a system adapted to operate with an asynchronous SRAM device, memory arrays are accessed by detecting an external address change and then activating a memory controller, since an asynchronous SRAM device has no external clock input. The maximum setup time from the external address change to a write enable active state, as well as the duration of the write enable active pulse, are not defined in an asynchronous SRAM device. The write data is valid within the setup time and until the write enable state is deactivated. Furthermore, in these devices, a read command can change to a write command at any time and the write command may be indefinite in length.

FIG. 1 illustrates one example of a timing diagram 10 for a write cycle of a widely-used asynchronous SRAM device of the prior art. Timing diagram 10 includes signal values for the device's address lines ("ADDRESSES"), write enable ("WE#"), chip enable inputs ("CE1#", "CE2"), upper and lower bit select inputs ("UB#", "LB#"), and data lines ("DQ15-8", "DQ7-0"). As shown in FIG. 1, before the external write enable signal WE# assumes a "low" value (i.e., a logic zero value), the system interprets the "high" value (i.e., a logic one value) of the signal as the read cycle and outputs the data on the data lines DQ15-9, DQ7-0. As a result, if a DRAM device were used in a system adapted to operate with this type of SRAM device, a refresh request could not be executed even after the read operation is finished. The address setup time $T_{AS}$ may have a minimum value of 0 nanoseconds ("ns") and an undefined maximum value. The write pulse width $T_{WP}$ also has an undefined maximum value. Hence, the total length of the write cycle $T_{WC}$ (i.e., from the beginning of the setup time $T_{AS}$ to the end of the write recovery time $T_{WR}$) can be very long and the write data can never be defined as valid before the write cycle finishes.

The foregoing attributes of an asynchronous SRAM device, would prevent a DRAM device from being refreshed if it were used within a prior system adapted to operate with asynchronous SRAM devices. As a result, a conventional DRAM array is not compatible with these prior systems. Some efforts have been made to limit maximum length of the parameters $T_{AS}$, $T_{WP}$ and $T_{WC}$ in order to implement DRAM arrays within these prior systems. However, these efforts typically require an external device to monitor the timing and refresh operations of the system, thereby undesirably increasing the cost and complexity of the systems. Moreover, these prior art attempts to implement DRAM arrays within these systems do not provide asynchronous SRAM functionality. For example, these prior art systems prevent access to the memory from being requested while refresh operations are running.

It is therefore desirable to provide a memory system which overcomes the foregoing drawbacks of prior memory systems and which has the ability to provide asynchronous SRAM functionality with a DRAM array by interrupting the external memory commands, such as read and write commands, in order to execute refresh operations.

SUMMARY OF THE INVENTION

A first non-limiting advantage of the invention is that it provides a system which utilizes a DRAM array to provide asynchronous SRAM functionality.

A second non-limiting advantage of the invention is that it provides asynchronous SRAM functionality with a DRAM array by selectively interrupting external memory commands, such as read and write commands, to perform internal refresh operations.

A third non-limiting advantage of the invention is that it provides a self-contained DRAM array that can be used to replace an asynchronous SRAM device within a computer system without any additional control or devices, thereby decreasing the cost and increasing the memory density of the system.

According to a first aspect of the present invention, a memory system having asynchronous SRAM functionality is provided. The system includes: a DRAM array; a first portion adapted to receive external memory commands and to detect external address transitions in order to perform read and write operations on the DRAM array asynchronously; and a second portion adapted to selectively interrupt the external memory commands in order to perform refresh operations on the DRAM array.

According to a second aspect of the present invention, a DRAM apparatus having asynchronous SRAM functionality is provided. The apparatus includes a DRAM array; a first portion which is adapted to receive external memory commands, including external memory addresses for performing read and write operations on the DRAM array asychronously; a second portion which is adapted to periodically generate interrupt signals for refreshing the DRAM array; a third portion which is adapted to receive data for write operations on the array; and a fourth portion which is adapted to control the read and write operations performed on the DRAM array, and to interrupt the external memory commands to perform refresh operations the DRAM memory array in response to the generated interrupt signals.

According to a third aspect of the present invention, a method for providing asynchronous SRAM functionality with a DRAM array is provided. The method includes the steps of receiving external memory commands; detecting an external address transition in order to perform read and write operations on the DRAM array asynchronously; and selectively interrupting the external memory commands to perform internal refresh operations on the DRAM array.

These and other features, advantages, and objects of the invention will become apparent by reference to the following specification and by reference to the following drawings.

DETAILED DESCRIPTION OF THE PREFERRED EMBODIMENT OF THE INVENTION

Figure 1:
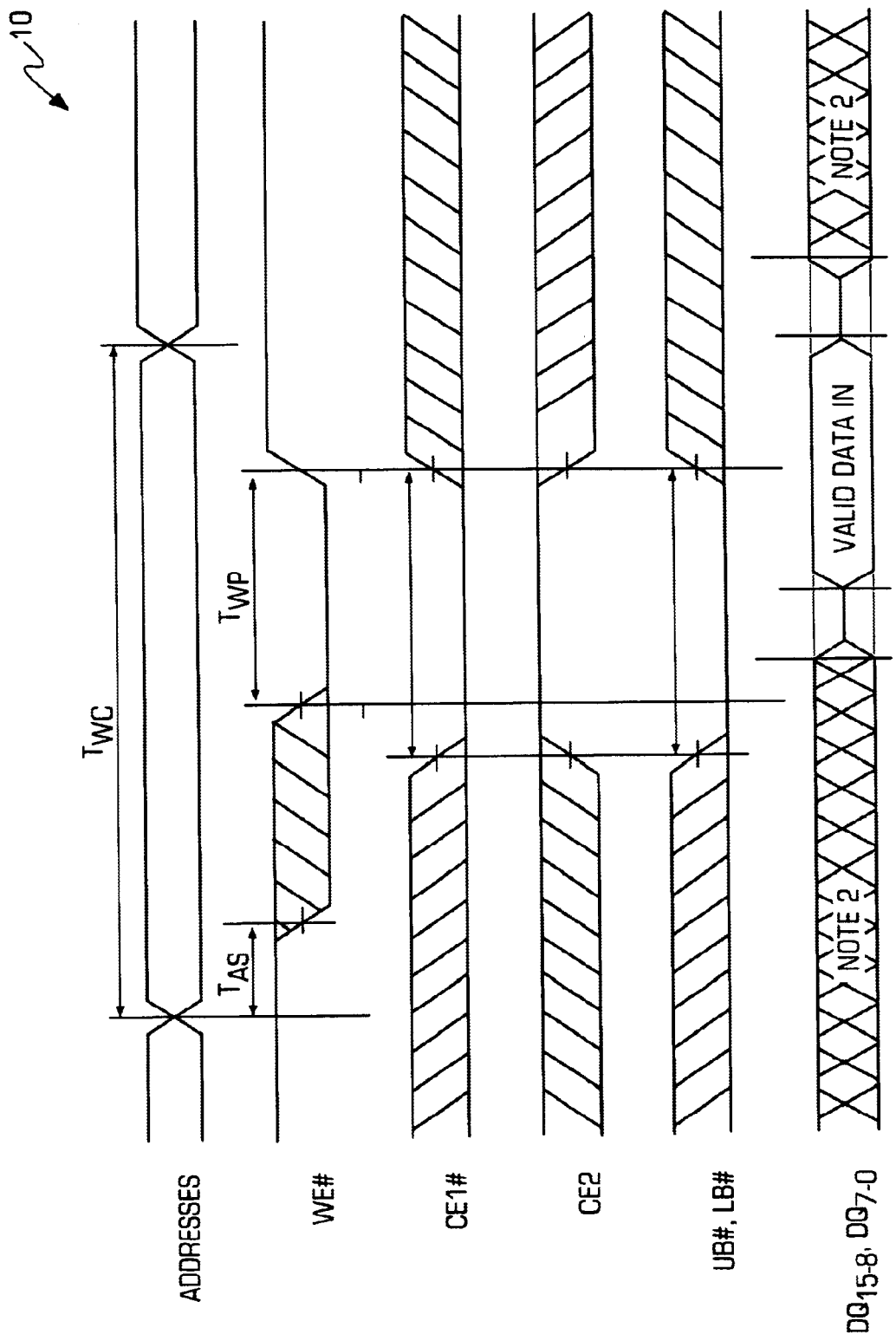
FIG. 1 is a write cycle timing diagram for an asynchronous SRAM device in accordance with the prior art.
Figure 2:
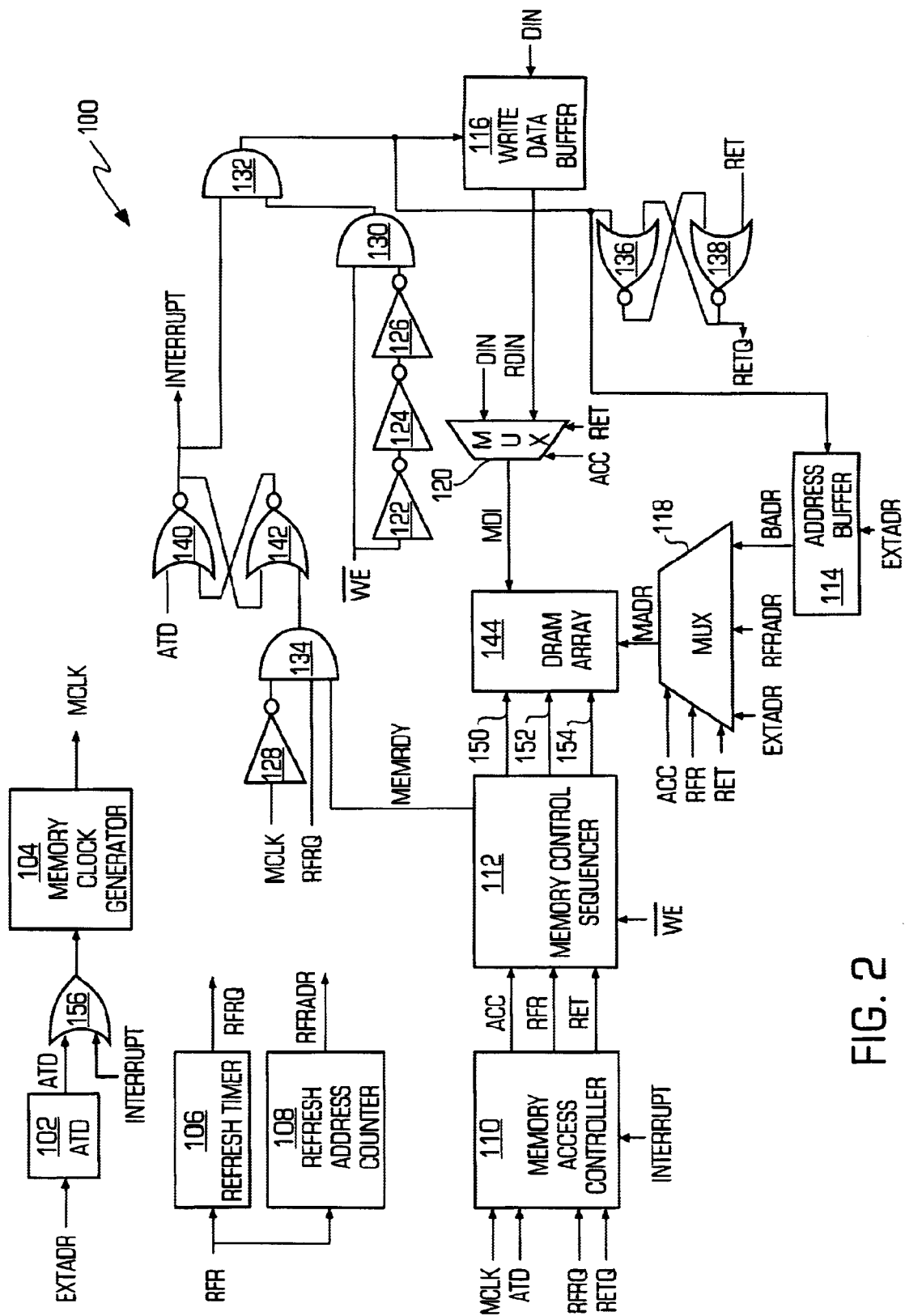
FIG. 2 is a block diagram of a system for providing asynchronous SRAM functionality with a DRAM array in accordance with the present invention.

FIG. 2 illustrates a DRAM system 100 that is made in accordance with a preferred embodiment of the present invention and that is adapted to provide asynchronous SRAM functionality. It should be appreciated by one of ordinary skill in the art that system 100 may comprise a removable portion or module of a larger computer system and may be used to replace an SRAM device or module within such a system.

In the preferred embodiment, system 100 includes the following circuit components: an address transition detector circuit 102, a memory clock generator circuit 104, a refresh timer 106, a refresh address counter 108, a memory access controller 110, a memory control sequencer 112, an address buffer 114, a write data buffer 116, a three-input address multiplexer 118, a two-input data multiplexer 120, inverters 122, 124, 126, and 128, AND gates 130, 132, and 134, NOR gates 136, 138, 140, and 142, OR gate 156, and a DRAM array 144 of memory cells. The foregoing components are communicatively and cooperatively linked together to provide asynchronous SRAM functionality by use of DRAM array 144, as described below.

Address transition detector circuit 102 comprises a conventional address transition detecting circuit. Address transition detector 102 is communicatively coupled to memory clock generator circuit 104 through an OR gate 156, and is adapted to receive an external address signal (EXTADR), and to communicate an output pulse signal (ATD) to OR gate 156 when the external address signal EXTADR changes (e.g., when the external addresses change). The OR gate 156 further receives an interrupt signal (INTERRUPT), and is adapted to communicate a pulse to memory clock generator 104 upon receiving output pulse signal ATD or interrupt signal INTERRUPT. Memory clock generator 104 is communicatively coupled to OR gate 156. Memory clock generator 104 comprises a conventional pulse generating circuit that includes a conventional delay chain that is first reset and subsequently generates a clock pulse (MCLK) upon receipt of a pulse from OR gate 156 (e.g., in response to either an ATD pulse or an INTERRUPT pulse).

At predetermined time intervals, refresh timer 106 generates a refresh request signal RFRQ, which is effective to cause system 100 to perform a refresh operation. Refresh timer 106 will cause the refresh request signal RFRQ to remain high, until it receives refresh command RFR, indicating that a refresh operation has been launched. Refresh address counter 108 generates a refresh address signal (RFRADR), which represents the addresses within DRAM array 144 that are to be refreshed during the refresh operation. Refresh address counter 108 also receives refresh command RFR, which automatically updates counter 108 after a refresh operation is completed. After all addresses within DRAM array 144 have been refreshed, counter 108 automatically resets.

Figure 8:
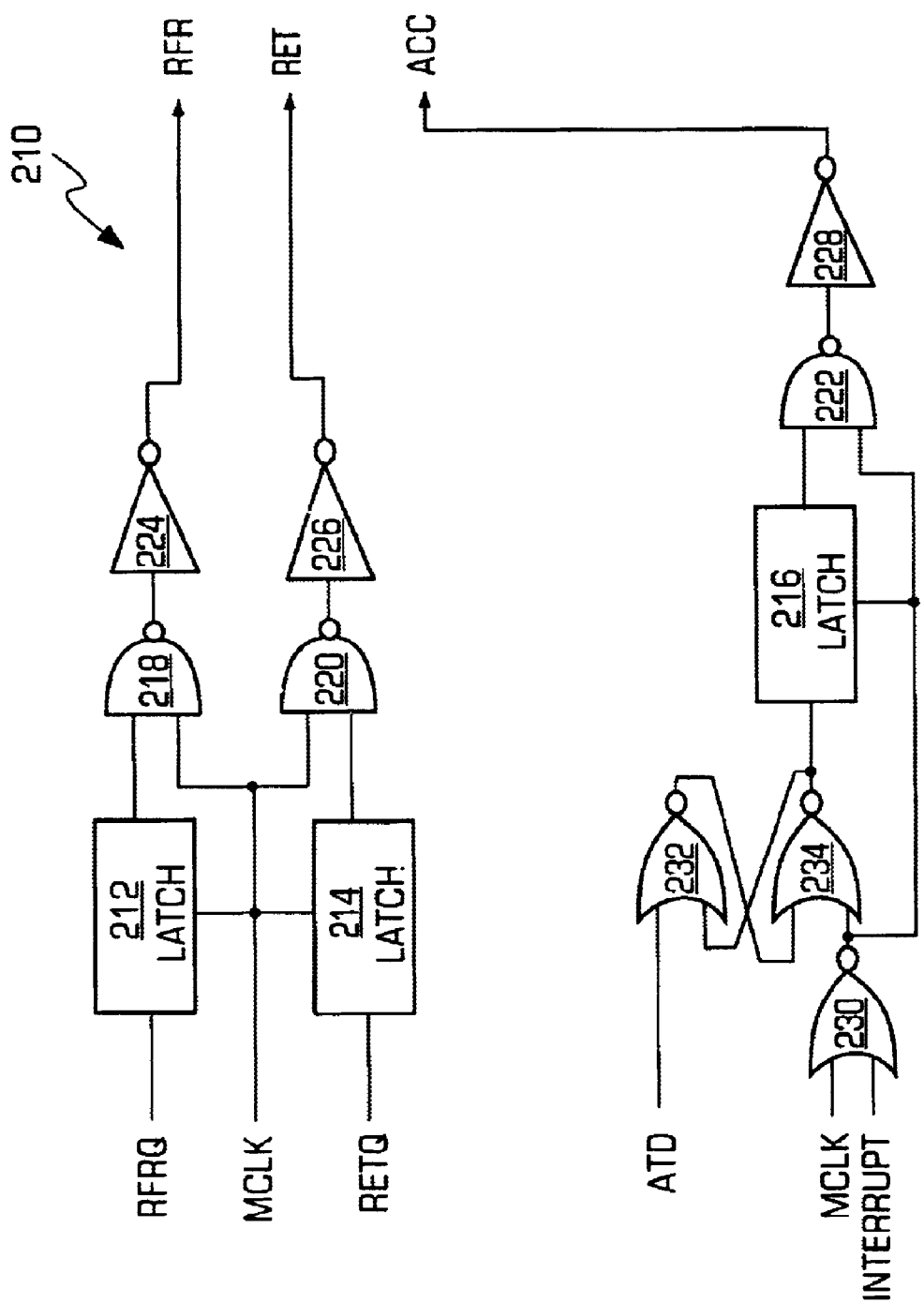
FIG. 8 is a block diagram of one non-limiting embodiment of a memory access controller for use with the system shown in FIG. 2.

Memory access controller 110 is a control circuit that is adapted to receive the following input signals: MCLK, ATD, RFRQ, and a retire request signal (RETQ). Based upon the foregoing received signals, memory access controller 110 selectively generates the following output signals: memory access command ACC, refresh command RFR, and retire command RET. Controller 110 generates signals RFR and RET only when MCLK is high, and generates signal ACC only when MCLK is low. In this manner, access to DRAM array 144 for performing read and write operations is only permitted when MCLK is low, and access to DRAM array 144 for performing refresh and "retire" operations is permitted only when MCLK is high. As described more fully and completely below, a "retire" operation refers to a memory operation in which unwritten data, that is stored within buffer 116, as a result of an unfinished write operation (e.g., a write operation that is interrupted to perform a refresh operation), is written into DRAM array 144 after a refresh operation is complete. Memory access controller 110 is communicatively coupled to memory control sequencer 112 and transmits the output signals ACC, RFR and RET to sequencer 112. In one non-limiting embodiment, controller 110 may take the form of the circuit 200 illustrated in FIG. 8. In this non-limiting embodiment, circuit 200 includes three conventional latches 212, 214 and 216, three NAND gates 218, 220 and 222, three inverters 224, 226 and 228, and NOR gates 230, 232 and 234. As should be appreciated by one of ordinary skill in the art, signals RFRQ and RETQ are latched and RFR and RET commands are accordingly asserted only when MCLK is high, and memory access command ACC is asserted only when MCLK is low.

Memory control sequencer 112 comprises a conventional DRAM memory sequencing chip which is adapted to execute read, write and refresh operations on DRAM array 144. Sequencer 112 is adapted to receive signals ACC, RFR, RET and an external read/write command or write enable ($\overline{WE}$), and to provide control signals 150, 152 and 154 to DRAM array 144, which control the timing and operation of the reading, writing and refreshing of the array 144 in a conventional manner. For example, when ACC is high, sequencer 112 may perform read and write operations on array 144 based upon the value of signal $\overline{WE}$; when RFR is high, sequencer 112 may perform refresh operations on array 144; and when RET is high, sequencer 112 may perform retire operations on array 144. Memory control sequencer 112 also determines when DRAM array 144 may be safely interrupted for a refresh operation and further generates a memory array ready signal (MEMRDY) to inform the system 100 that the DRAM array 144 may be refreshed. In the preferred embodiment, sequencer 112 determines that array 144 may be interrupted and generates the MEMRDY signal when a read operation has been completed or when a write operation has been partially or fully completed.

The NOR gates 140, 142, the AND gate 134, and the inverter 128 cooperatively control the assertion of the interrupt signal (INTERRUPT). Particularly, the interrupt signal may be asserted when both MEMRDY and RFRQ are high and MCLK is low. The INTERRUPT signal is de-asserted when the ATD signal is asserted in response to a change in the external addresses EXTADR. The AND gates 130, 132 and the inverters 122, 124, 126 cooperate to generate a pulse when $\overline{WE}$ changes from low to high, and the INTERRUPT signal is asserted. The generated pulse is communicated to write data buffer 116 and address data buffer 114. Upon receipt of the pulse, write data buffer 116 registers write data DIN as retire data signal (RDIN), and address buffer 114 registers EXTADR as retire or buffer address signal (BADR). The NOR gates 136, 138 cooperate to assert retire request signal RETQ for a retire request and to later de-assert RETQ when the retire operation is launched.

Multiplexer 118 receives signals ACC, RFR and RET, and signals EXTADR, RFRADR, and BADR. Based upon the values of signals ACC, RFR and RET, multiplexer 118 selects the appropriate signal EXTADR, RFRADR or BADR to communicate to DRAM array 144 as the memory address signal (MADR). Particularly, if a memory access command ACC is being asserted, multiplexer 118 communicates signal EXTADR to DRAM array 144; if a refresh command RFR is being asserted, multiplexer 118 communicates signal RFRADR to DRAM array 144; and if a retire command RET is being asserted, multiplexer 118 communicates signal BADR to DRAM array 144.

Multiplexer 120 receives signals ACC and RET, and signals DIN and RDIN. Based upon the values of signals ACC and RET, multiplexer 120 selects the appropriate write data DIN or RDIN to communicate to DRAM array 144 as the memory write data signal MDI. Particularly, if a memory access command ACC is being asserted, multiplexer 120 communicates the write data DIN to DRAM array 144; and if a retire command RET is being asserted, multiplexer 120 communicates the retire data RDIN to DRAM array 144. DRAM array 144 utilizes the control signals 150, 152 and 154, and signals MADR and MDI, in a conventional manner, to read and refresh data at the appropriate addresses MADR, and to write and retire data MDI at the appropriate addresses MADR.

It should be appreciated that the system 100 illustrated in FIG. 2 may further include additional and/or different circuit elements or portions which assist in the reading, writing, refreshing and retiring of data to and from DRAM array 144 such as additional buses, sense amplifiers, multiplexers, buffers, counters, shift registers, logic circuits and other circuit components necessary and/or desirable to read, write and refresh data.

In operation, memory access controller 110 and memory control sequencer 112 are effective to selectively interrupt memory access (e.g., read and write commands) to DRAM array 144 in order to perform periodic refresh operations. When refresh timer 106 generates a refresh request command RFRQ, and the DRAM array 144 is set to be interrupted during the external memory access period (e.g., the MEMRDY signal is high), the INTERRUPT signal is generated, effective to halt the current memory command. The memory control sequencer 112, then executes a refresh operation on DRAM array 144 at the refresh addresses RFRADR provided by multiplexer 118.

If a read operation is being performed when the INTERRUPT signal is generated, the read operation will be completed before the read cycle is interrupted (i.e., before memory access is terminated or ACC is switched from high to low). Interrupting a read operation prior to its completion is unnecessary due to the relatively short period of time required to perform a read operation. While the INTERRUPT signal is asserted (e.g., has a logic one value), no further external memory commands will be executed on DRAM array 144.

If a write operation is being performed when the INTERRUPT command is asserted, sequencer 112 halts the write operation prior to its completion. The unwritten data is then stored in buffer 116, and is subsequently "retired" to the array 144 (i.e., written into the array 144) after the refresh operation is completed. When a write operation on DRAM array 144 is interrupted, the write enable signal $\overline{WE}$ switches from active to disabled, the external address EXTADR is registered in the address buffer 114, and the write data is registered in the write data buffer 116. The unwritten data will be retired to the DRAM array 144 as RDIN at the registered memory address EXTADR, after the refresh operation has been completed and another address transition is detected.

System 100 utilizes the address transition detector 102 to initiate read and write operations, thereby allowing read and write operations to be performed asynchronously. When the external address EXTADR changes, the address transition detector circuit 102 generates the ATD signal, which triggers the memory clock generator 104 to output the MCLK signal. Memory clock generator 104 may also be triggered by the interrupt command INTERRUPT. The pulse width of the MCLK signal is controlled by the internal delay chain within generator 104. When the generator 104 is triggered, it is first reset but still maintains the state of the signal MCLK to avoid a glitch. Generator 104 then propagates MCLK from the beginning of the delay chain. In this manner, generator 104 may extend the pulse width of MCLK when the address transition detector 102 detects another external address change while generator 104 is concurrently generating a MCLK pulse. As a result, the external address skew can be filtered before the external memory transaction begins. During the MCLK pulse (i.e., when MCLK is high), refresh or retire operations can be executed on the DRAM array 144, based on the refresh request command RFRQ and retire request command RETQ. After the MCLK pulse ends (i.e., when MCLK is low), the external memory access request ACC can be executed to perform read and write operations on array 144.

External memory commands to system 100 can be interrupted after the DRAM array 144 has been read and written back in order to execute a memory refresh operation. The standard operation of DRAM array 144 is as follows: the designated row(s) within array 144 is activated; data from the selected row(s) is read (or data is written to the DRAM array 144 if a write operation has been activated); data read is written back into the array 144; and the selected row(s) is deactivated. After data has been written back to the DRAM array 144, the selected row(s) can be deactivated at any time without jeopardizing the data.

System 100 can force the selected row(s) in the DRAM array 144 to be deactivated at an earlier time by generating an INTERRUPT signal when a refresh operation is requested during a write operation. If the INTERRUPT signal occurs during a write cycle, the write data DIN may not be valid when the selected row(s) is deactivated. As a result, the data in the DRAM array 144 corresponding to the external memory address EXTADR might be corrupted. Thus, system 100 registers the write data DIN once the data is valid and an INTERRUPT signal has been generated. Based on the widely-used asynchronous SRAM specification, the write data DIN is valid within the setup time of the external write enable signal $\overline{WE}$ becoming disabled. Once the external write enable signal $\overline{WE}$ is disabled, the external addresses EXTADR and write data DIN can be registered (as BADR and RDIN, respectively) for the next retire operation. In the interim, the retire operation will be requested, but will not be executed until the next external memory operation request occurs. Once the next memory operation request is generated, the registered data will be retired at the appropriate addresses within DRAM array 144, thereby preventing the corruption of data.

In this manner, the system 100 acts as a "stand-alone" memory device having a DRAM core, which can perform self-refresh operations. The system 100 utilizes address transition detector 102 to function alone as an asynchronous SRAM without any external logic. Moreover, memory access can always be requested from system 100, even when system 100 is performing a refresh operation.

Figure 3:
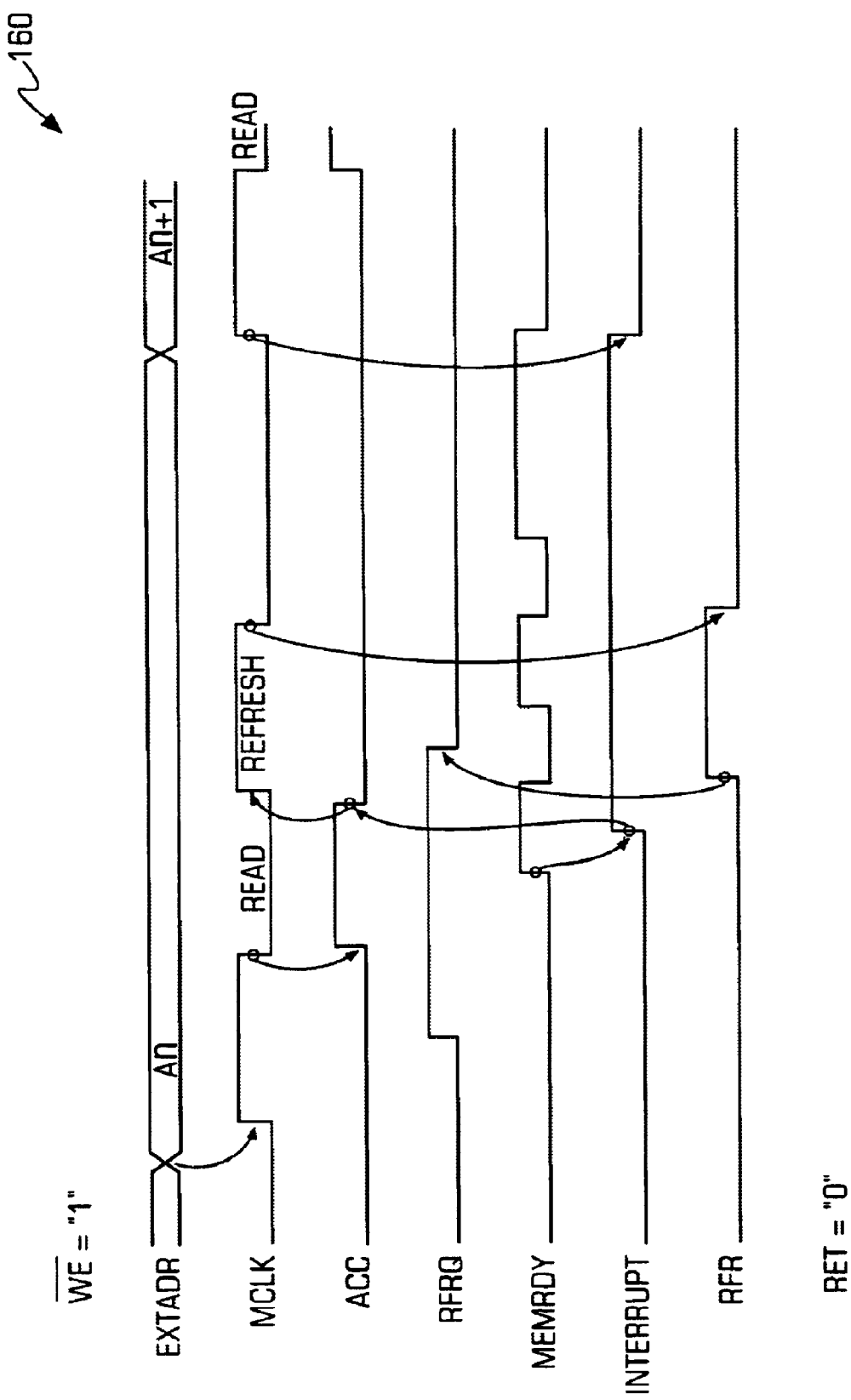
FIG. 3 is an exemplary timing diagram for the present invention illustrating read and refresh operations.

The foregoing operation of system 100 may be further described with reference to the following timing diagrams, illustrating several non-limiting examples of operational sequences of system 100. The timing diagram 160 of FIG. 3 illustrates back-to-back read operations being performed on system 100 with an interim refresh operation. The write enable signal $\overline{WE}$ is high throughout the timing diagram, indicative of a read cycle. When the external addresses EXTADR change to addresses "An," memory clock generator 104 generates one MCLK pulse. Since no refresh request is issued before EXTADR changes, no memory operation occurs while MCLK is high. When MCLK switches from high to low, memory access controller 110 asserts memory access command ACC, and begins the read cycle. In this sequence, the refresh request is issued after the address EXTADR changes, and causes the INTERRUPT command to be asserted when the MEMRDY command is high (i.e., once the read operation is complete). The INTERRUPT command forces ACC to become low, which ends the read cycle. The end of the read cycle, in turn, causes memory clock generator 104 to generate another MCLK pulse, during which system 100 executes the refresh operation. The INTERRUPT signal will remain high until another address change is detected by circuit 102. The address change will force the INTERRUPT signal low, and will generate another MCLK pulse. At the end of the MCLK pulse, another read operation is performed.

Figure 4:
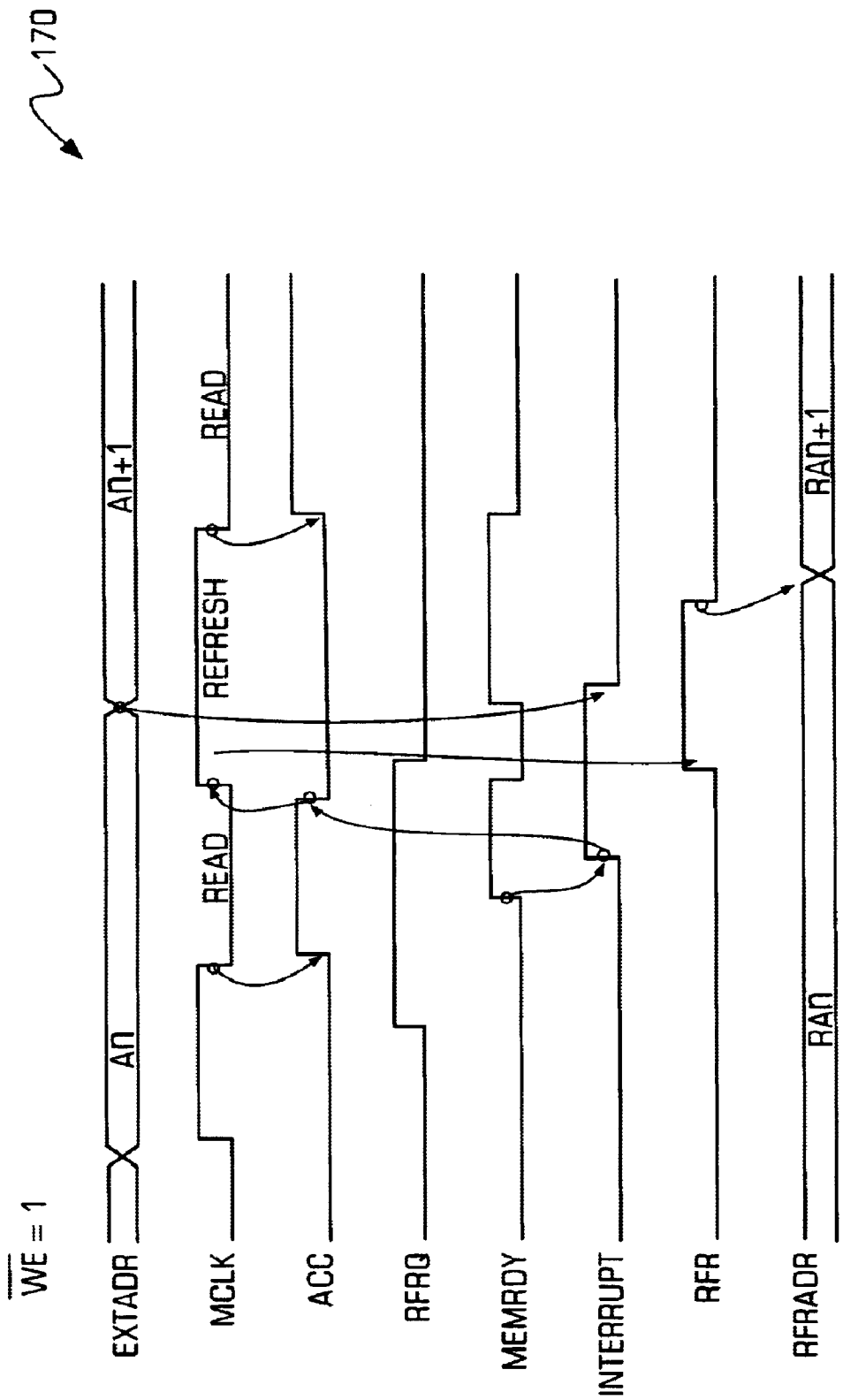
FIG. 4 is an exemplary timing diagram for the present invention illustrating the interruption of a read cycle to perform a refresh operation.

The timing diagram 170 of FIG. 4 illustrates another operational sequence being performed on system 100. The sequence illustrated in FIG. 4 is similar to that illustrated in FIG. 3, with the exception that the external address EXTADR changes to An+1 during the refresh operation. As in the previous timing diagram, the INTERRUPT signal terminates the read cycle (i.e., once the ongoing read operation is complete), and the MCLK pulse is generated for the refresh operation. However, the change of EXTADR during the refresh operation causes memory clock generator 104 to extend the MCLK pulse, and further causes the INTER-RUPT command to be de-asserted. As a result, memory access command ACC may be asserted and the second read operation may be immediately performed as soon as the refresh operation is terminated. Refresh address counter 108 changes the refresh address RFRADR from RAn to RAn+1, so that the refresh operation can re-commence at the appropriate address in array 144.

Figure 5:
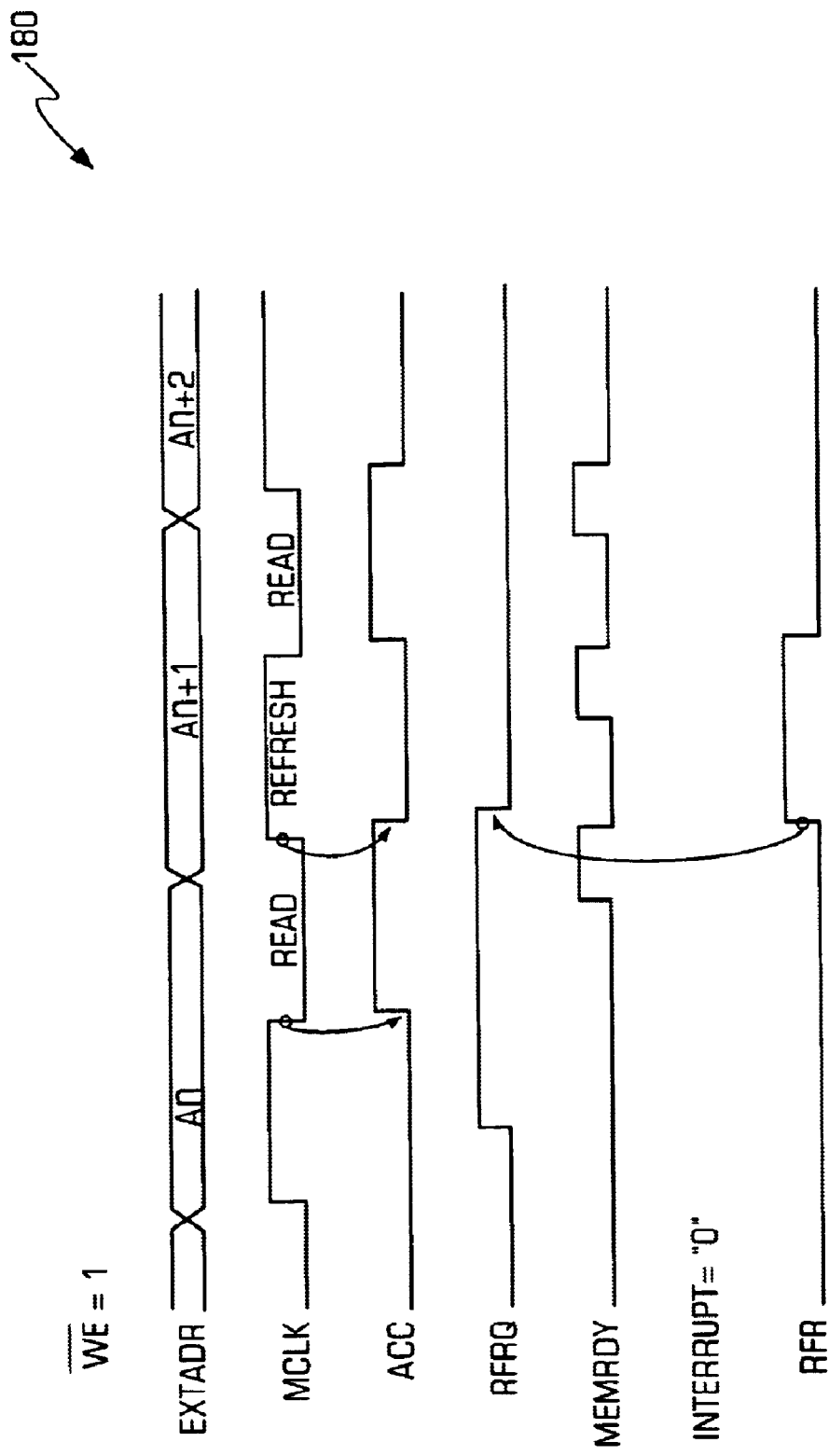
FIG. 5 is an exemplary timing diagram for the present invention illustrating read, refresh and read operations.

The timing diagram 180 of FIG. 5 illustrates an operational sequence similar to that shown in FIG. 4, with the exception that the external address EXTADR changes from An to An+1 before an interrupt command can be asserted. In the sequence shown in FIG. 5, a second MCLK pulse is generated from the address change instead of being generated in response to an INTERRUPT command. The refresh operation is still executed at the second MCLK pulse, and is immediately followed by a second read operation.

Figure 6:
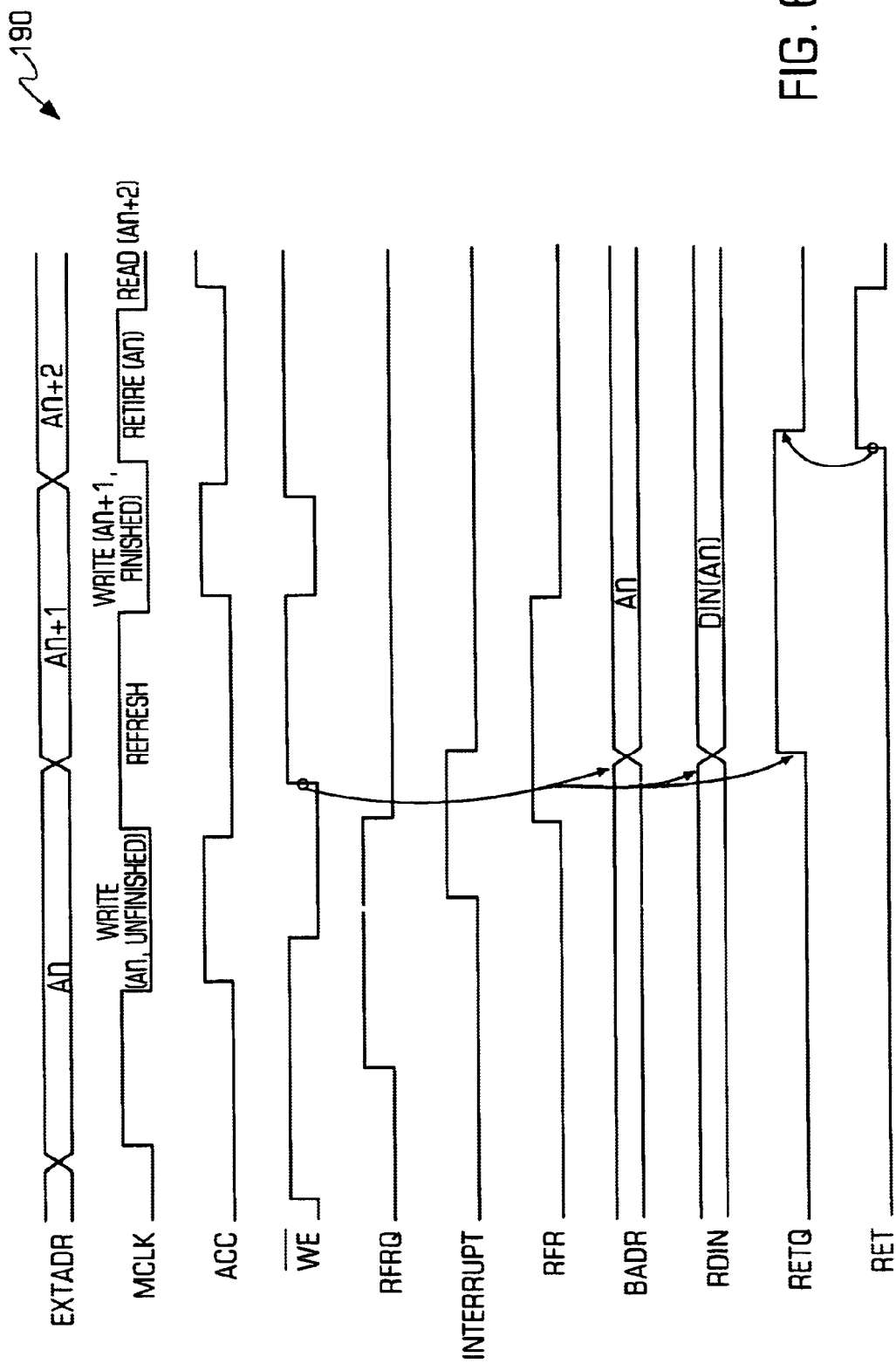
FIG. 6 is an exemplary timing diagram for the present invention illustrating write, refresh, retire and read operations.

The timing diagram 190 of FIG. 6 illustrates back-to-back write operations being performed on system 100. When the external addresses EXTADR change to addresses An, memory clock generator 104 generates one MCLK pulse. Since no refresh request is issued before EXTADR changes, no memory operation occurs while MCLK is high. When MCLK switches from high to low, memory access controller 110 asserts memory access command ACC, and begins the write operation. In this sequence, the refresh request is issued after the address EXTADR changes, and causes the INTERRUPT command to be asserted when the write operation is being performed. The INTERRUPT command forces ACC to become low, which ends the write operation before it is finished, and further causes memory clock generator 104 to generate another MCLK pulse. The generated MCLK pulse is effective to execute the refresh operation. During the refresh operation, the address EXTADR changes and extends the width of pulse MCLK. When the write enable signal $\overline{WE}$ changes from low to high, system 100 updates BADR and RDIN with the write addresses and data from the unfinished write operation, and generates a retire request RETQ. When system 100 completes the refresh operation, it performs a second write operation at address An+1. After completing the second write operation, EXTADR changes to An+2, and system 100 asserts the retire command RET and retires the first write data to array 144. System 100 deactivates the retire request RETQ once the retire command RET is launched.

Figure 7:
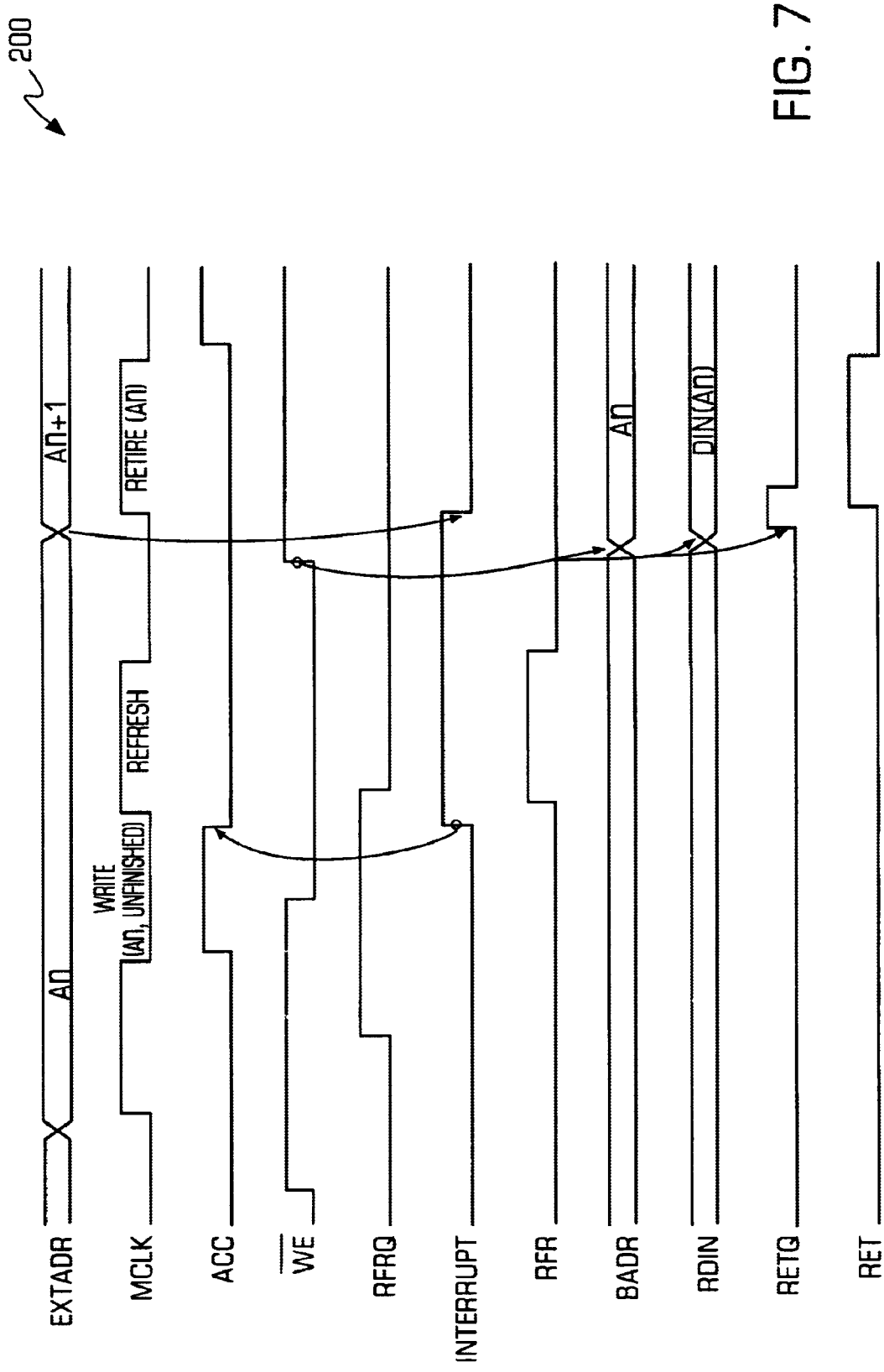
FIG. 7 is an exemplary timing diagram for the present invention illustrating write, refresh and retire operations.

The timing diagram 200 of FIG. 7 illustrates an operational sequence similar to that shown in FIG. 6, with the exception that the external address EXTADR does not change until after the refresh operation is completed. In the sequence shown in FIG. 7, system 100 generates the second MCLK pulse for the refresh operation. After system 100 completes the refresh operation, it generates a third MCLK pulse, and retires the remaining data within the write data buffer to the DRAM array 144.

As illustrated by the foregoing timing diagrams, system 100 can continuously receive external memory commands, even while a refresh operation is occurring, and will selectively interrupt the memory commands to perform refresh operations. The present invention does not require any additional external signals, devices or control. System 100 provides a self-contained DRAM array that has the functionality of an asynchronous SRAM device, and that can be used to replace an asynchronous SRAM device. The invention will appear and function as an asynchronous SRAM to an external computer system. The system 100 allows access to the DRAM array 100 by use of address transition detector 102, which detects external address changes. As such, the system 100 can be used in the place of an asynchronous SRAM device and provide improved memory density at a reduced cost. The present invention achieves this performance by selectively interrupting external memory commands, such as read and write commands, in order to perform internal refresh operations.

It should be understood that the inventions described herein are provided by way of example only and that numerous changes, alterations, modifications, and substitutions may be made without departing from the spirit and scope of the inventions as delineated within the following claims.

What is claimed is:

1. A memory system having asynchronous SRAM functionality comprising:
   a DRAM array;
   a first portion adapted to receive external memory commands and to detect external address transitions in order to perform read and write operations on said DRAM array asynchronously;
   a second portion adapted to selectively interrupt said external memory commands in order to perform refresh operations on said DRAM array, and to selectively interrupt write operations in progress on said DRAM array; and
   a third portion adapted to perform read, write, refresh and retire operations on said DRAM array, and including a write data buffer for registering unwritten write data when a write operation is interrupted, and an address buffer for registering an address signal corresponding to said unwritten write data, wherein the third portion selectively retires said unwritten write data to said DRAM array after a refresh operation is completed.

2. The memory system of claim 1 further comprising a memory control sequencer which is communicatively coupled to said DRAM array and which controls the read, write, refresh, and retire operations performed on said DRAM array.

3. The memory system of claim 2 further comprising a refresh address counter which provides addresses to said DRAM array for said refresh operations.

4. A DRAM apparatus having asynchronous SRAM functionality comprising:
   a DRAM array;
   a first portion which is adapted to receive external memory commands, including external memory addresses for read and write operations on said DRAM array asynchronously;
   a second portion which is adapted to periodically generate interrupt signals for refreshing said DRAM array;
   a third portion which is adapted to receive data for write operations on said array;
   a fourth portion which is adapted to control said read and write operations performed on said DRAM array, and to interrupt said external memory commands to perform refresh operations said DRAM memory array in response to said generated interrupt signals;
   a write data buffer which is adapted to store unwritten data when a write operation is interrupted; and
   a write address buffer which is adapted to store write addresses associated with said unwritten data;
   wherein said fourth portion is adapted to retire said unwritten data to said DRAM array after a refresh operation has been performed.

5. The DRAM apparatus of claim 4 wherein said first portion comprises an address transition detector.

6. The DRAM apparatus of claim 4 further comprising:
   a first multiplexer which is adapted to receive refresh addresses, external memory addresses and retire addresses, and to selectively communicate said addresses to said DRAM array based upon the operation being performed on said DRAM array.

7. The DRAM apparatus of claim 6 wherein said third portion comprises a second multiplexer which is adapted to receive data for write and retire operations and to selectively communicate said data to said DRAM array based upon the operation being performed on said DRAM array.

8. The DRAM apparatus of claim 7 wherein said first position further comprises a memory clock generator which generates a first signal.

9. The DRAM apparatus of claim 8 wherein said fourth portion is adapted to perform said refresh and retire operations when said first signal has a first value.

10. The DRAM apparatus of claim 9 wherein said fourth portion is adapted to perform said read and write operations only when said first signal has a second value which is different from said first value.

11. A method for providing asynchronous SRAM functionality with a DRAM array, comprising the steps of:
    receiving external memory commands;
    detecting an external address transition in order to perform read and write operations on said DRAM array asynchronously;
    selectively interrupting said external memory commands to perform internal refresh operations on said DRAM array;
    periodically generating a refresh request signal;
    asserting an interrupt signal in response to said refresh request signal, said asserted interrupt signal being effective to interrupt a write operation in progress;
    storing unwritten data from said write operation within a first buffer;
    storing at least one address associated with said unwritten data in a second buffer;
    performing a refresh operation on said DRAM array; and
    retiring said unwritten data to said DRAM array at said at least one address after said refresh operation is complete.

12. The method of claim 11 further comprising the step of:
    detecting an external address transition prior to retiring said unwritten data.

13. The method of claim 11 wherein said external memory commands comprise a read command for performing a read operation, and wherein said read command is interrupted after said read operation is complete.

14. The method of claim 11 further comprising the steps of:
    detecting an external address transition;
    de-asserting said interrupt signal in response to said detection; and
    executing an external memory command on said DRAM array once said interrupt signal has been de-asserted.

* * * * *